(12) United States Patent
Kuo

(10) Patent No.: US 6,176,743 B1
(45) Date of Patent: Jan. 23, 2001

(54) ELECTRICAL ADAPTER

(75) Inventor: Peter Kuo, Chung-Ho (TW)

(73) Assignee: Hon Hai Precision Ind. Co., Ltd., Taipei Hsien (TW)

(*) Notice: Under 35 U.S.C. 154(b), the term of this patent shall be extended for 0 days.

(21) Appl. No.: 09/461,563

(22) Filed: Dec. 14, 1999

(51) Int. Cl.⁷ ..................................... H05K 1/11
(52) U.S. Cl. ......................... 439/638; 439/75; 439/654
(58) Field of Search ................... 439/638, 650, 439/651, 654, 655, 75, 76.1

(56) References Cited

U.S. PATENT DOCUMENTS 4,076,356 * 2/1978 Tamburro .................... 439/75 X
4,084,869 * 4/1978 Yen .......................... 439/651 X
4,149,764 * 4/1979 Mattingly, Jr. ................. 439/75
5,242,310 * 9/1993 Leung ....................... 439/76.1

* cited by examiner

Primary Examiner—Renee Luebke
(74) Attorney, Agent, or Firm—Wei Te Chung

(57) ABSTRACT

An adapter of the present invention comprises two different types of connectors and an adapting device. The adapting device comprises a plurality of conducting pins and two printed circuit boards (PCBs). The two PCBs comprise a plurality of aligned through holes. The conducting pins are inserted through and retained in the aligned through holes of the two PCBs to connect the two PCBs. The two PCBs are contacted by three rows of terminals of the first type electrical connector on three of surfaces thereof near one end thereof. One of the two PCBs is straddled by two rows of terminals of the second type electrical connector on opposite surfaces of the other end thereof.

11 Claims, 6 Drawing Sheets

ELECTRICAL ADAPTER

BACKGROUND OF THE INVENTION

1. Field of the Invention

The present invention relates to an electrical adapter, and particularly to an electrical adapter for joining two electrical connectors having different designs and configurations.

2. Description of the Prior Art

A computer mainframe and its periphery device, for example, a monitor is usually electrically connected together by a cable connector assembly, wherein the cable connector assembly has two connectors at its two ends with one connector being used to mate with an electrical connector of the monitor and the other being used to mate with an electrical connector of the computer mainframe.

As the computer technology evolves, new type monitors (for example, digital monitors) with advanced functions are developed which are equipped with connectors having a different configuration in comparison with that of the old ones. To connect the computer mainframe with the new type monitor, an adapter is necessary whereby the cable in the present use can be utilized. The adapter includes two connectors in both ends wherein one is configured suitably for mating with the connector in the new type monitor, and the other is so configured that it can mate with the cable connector assembly.

The connectors of the conventional adapter are usually interconnected using a flat cable, a single printed circuit board (PCB), or discrete conducting wires. The conductors of the flat cable and the discrete conducting wires for interconnection need to be connected with terminals of the connectors by soldering, respectively, thereby decreasing production efficiency and complicating production procedure.

When one of the connectors of the adapter has more than two rows of terminals, to mount such terminals onto a single board having two circuit faces is relatively difficult.

Therefore, an improved adapter is desired.

SUMMARY OF THE INVENTION

The main object of the present invention is to provide an adapter wherein one of the connectors which has more than two rows of terminals can be easily and economically connected to another connector having terminals arranged in less rows.

An adapter in accordance with the present invention comprises two connectors and an adapting device. The adapting device comprises two PCBs and a plurality of conducting pins. The two connectors have terminals being arranged in rows of different numbers and having different configurations.

The PCBs each have a plurality of through holes. The through holes of one PCB are aligned with the through holes of the other PCB and the conducting pins are inserted through and retained in the aligned through holes.

The two PCBs register each other on one end thereof and are contacted with three-row terminals of one of the two connectors on three surfaces of these ends thereof. The other end of one of the PCBs is straddled by and contacted with two rows of terminals of the other one of the two connectors on two surfaces thereof.

Other objects, advantages and novel features of the invention will become more apparent from the following detailed description of the present embodiment when taken in conjunction with the accompanying drawings.

DETAILED DESCRIPTION OF THE INVENTION

Figure 1:
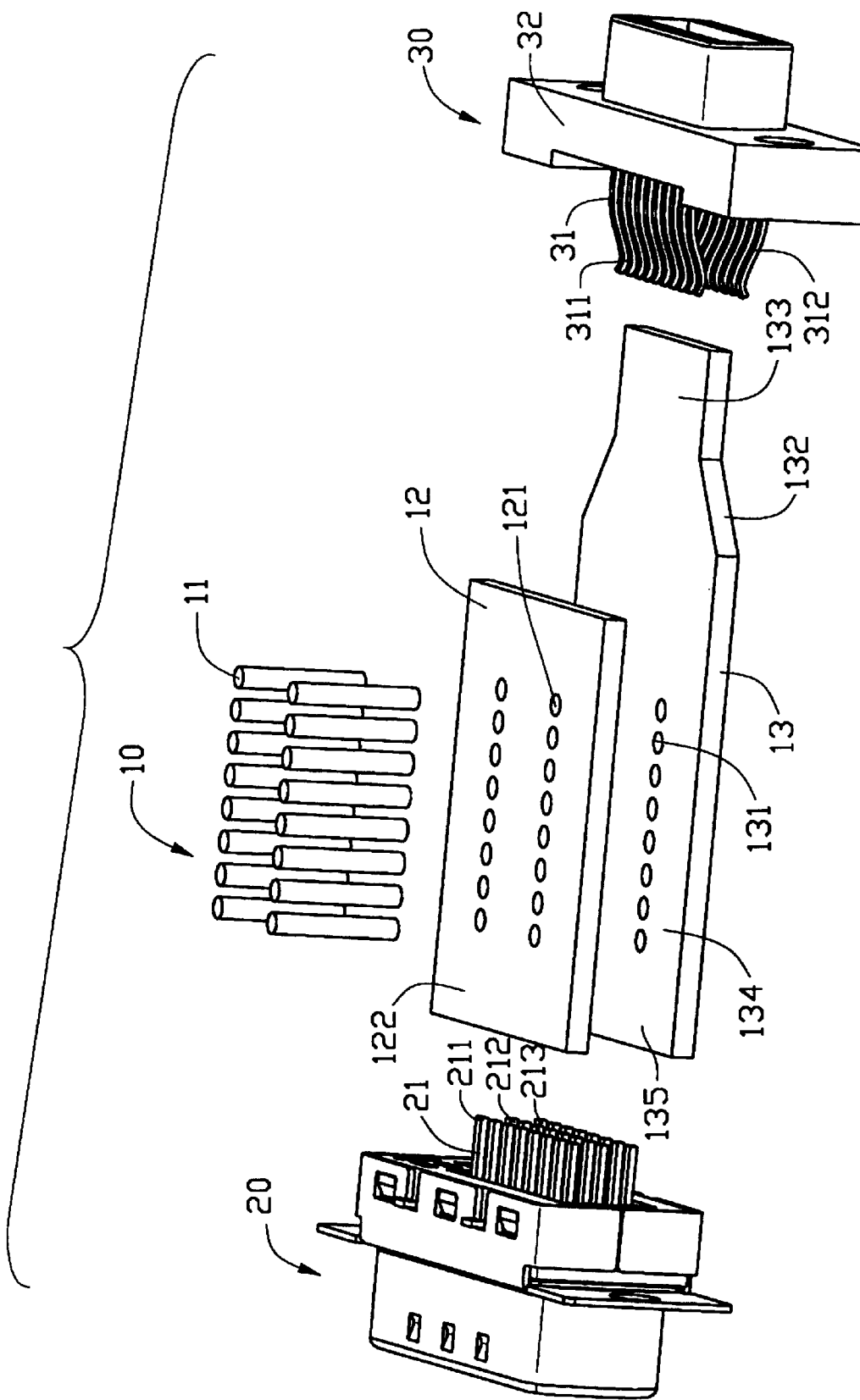
FIG. 1 is an exploded view of an adapter in accordance with the present invention.
Figure 2:
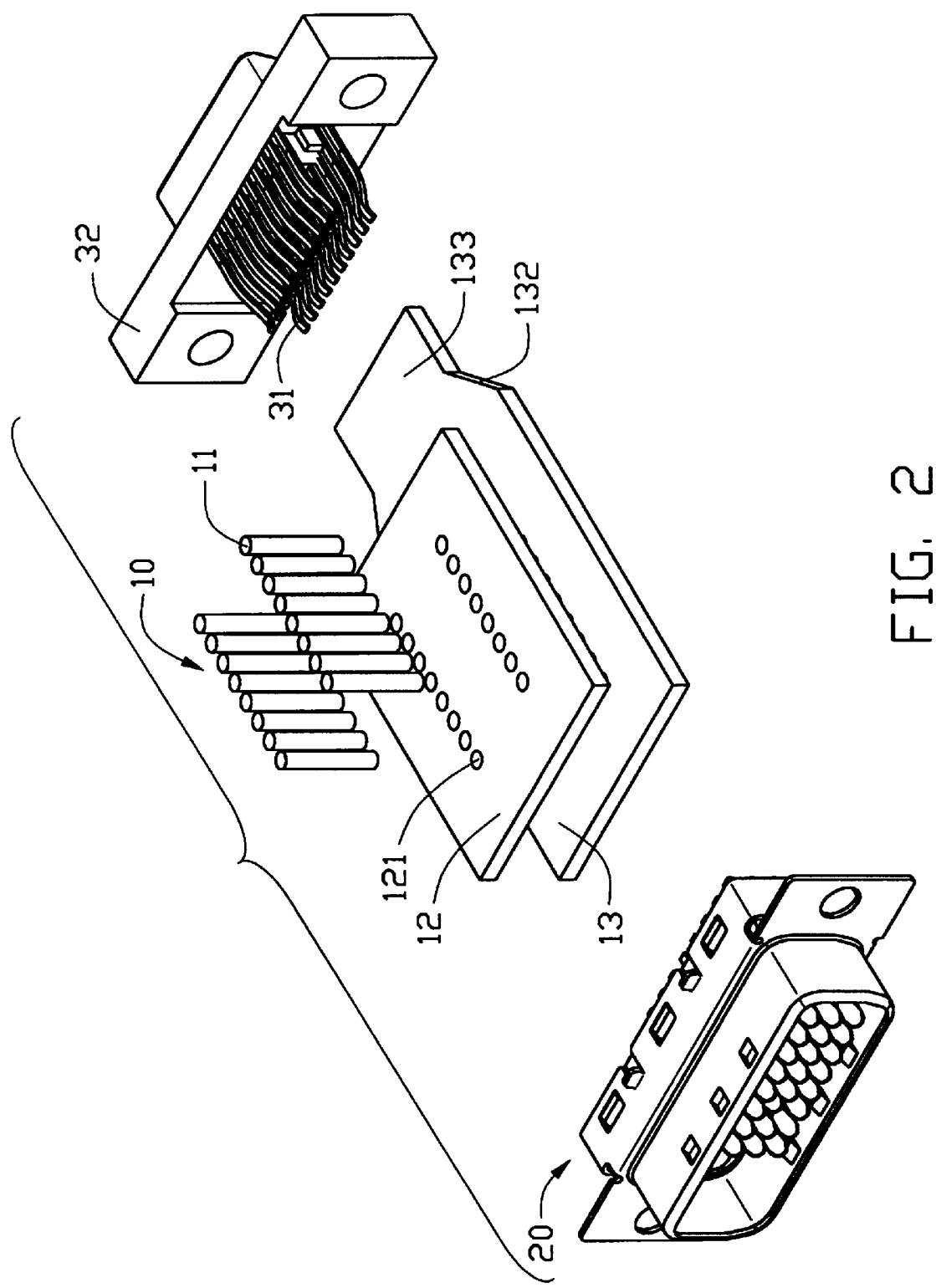
FIG. 2 is similar to FIG. 1 but taken from a left perspective.
Figure 3:
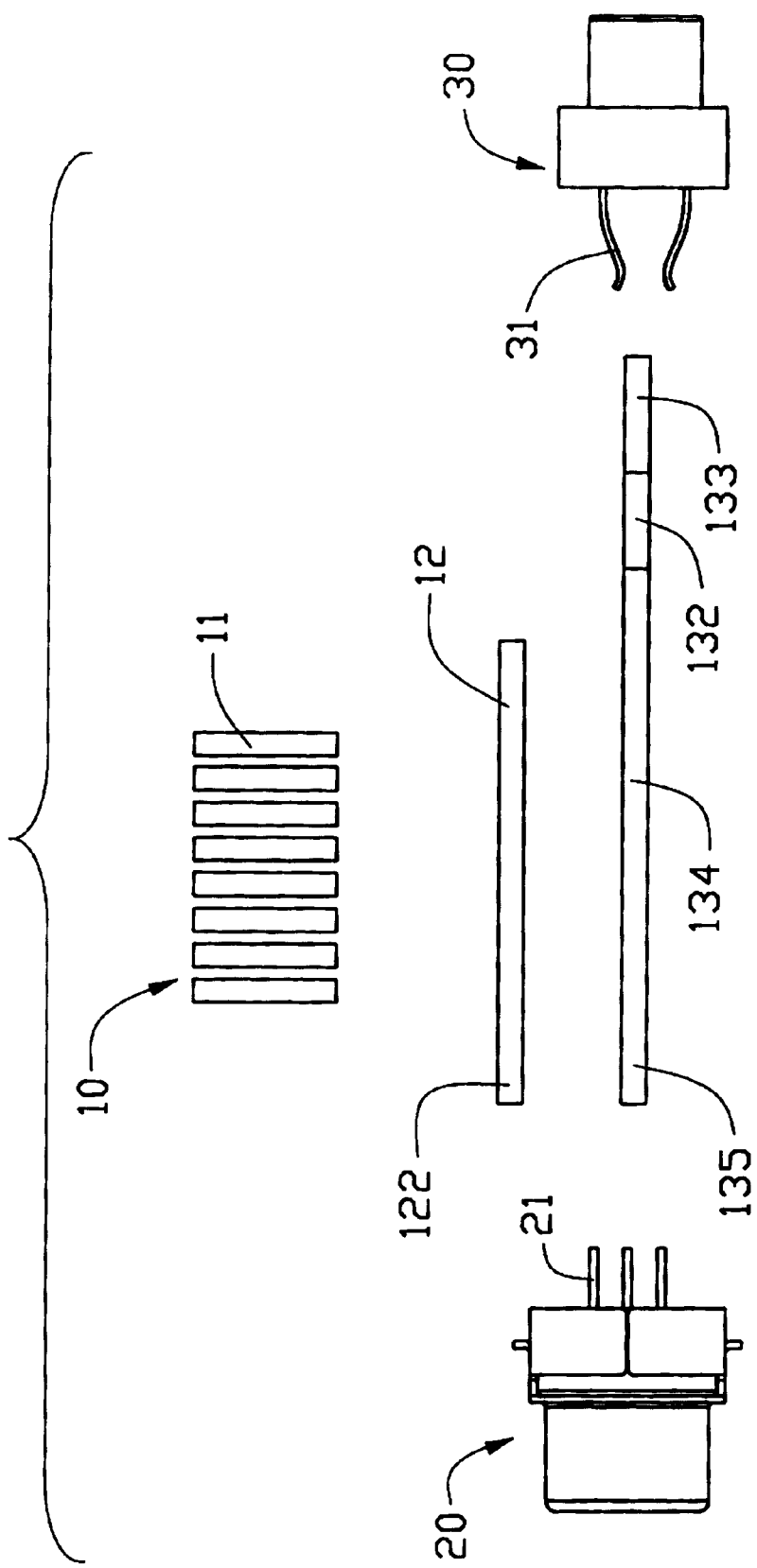
FIG. 3 is a side elevation view of FIG. 1.
Figure 4:
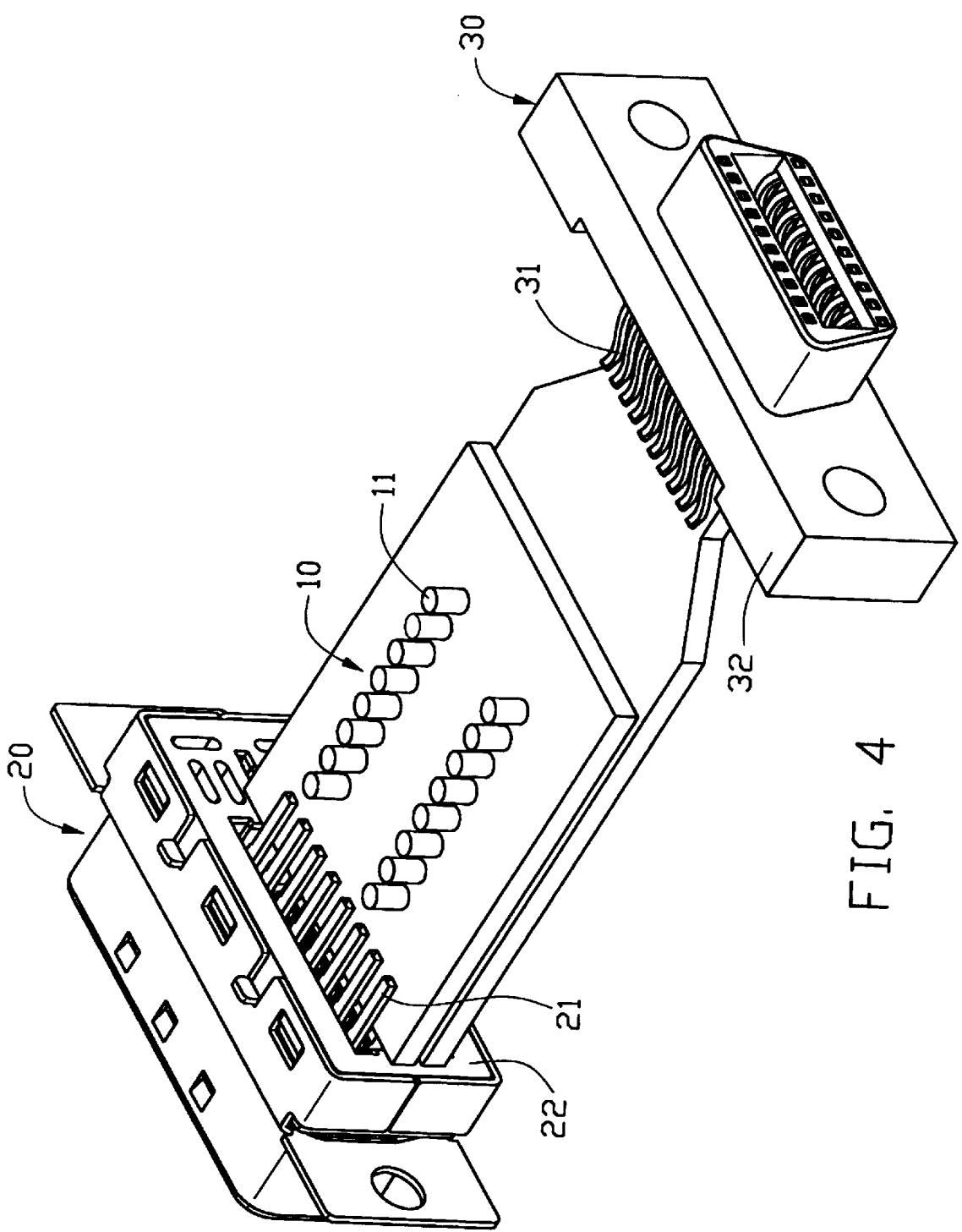
FIG. 4 is an assembled view of FIG. 1.
Figure 5:
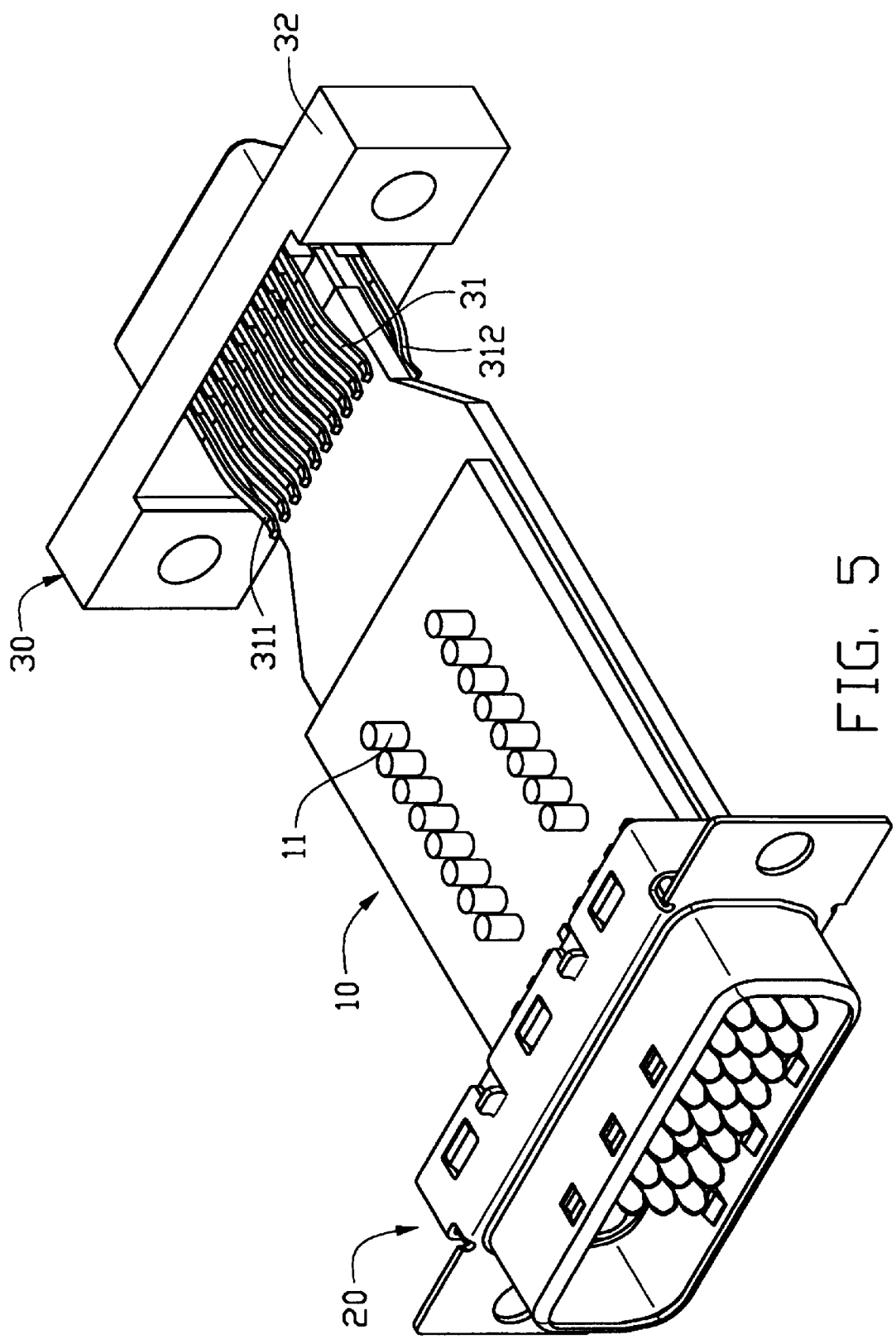
FIG. 5 is an assembled view of FIG. 2.
Figure 6:
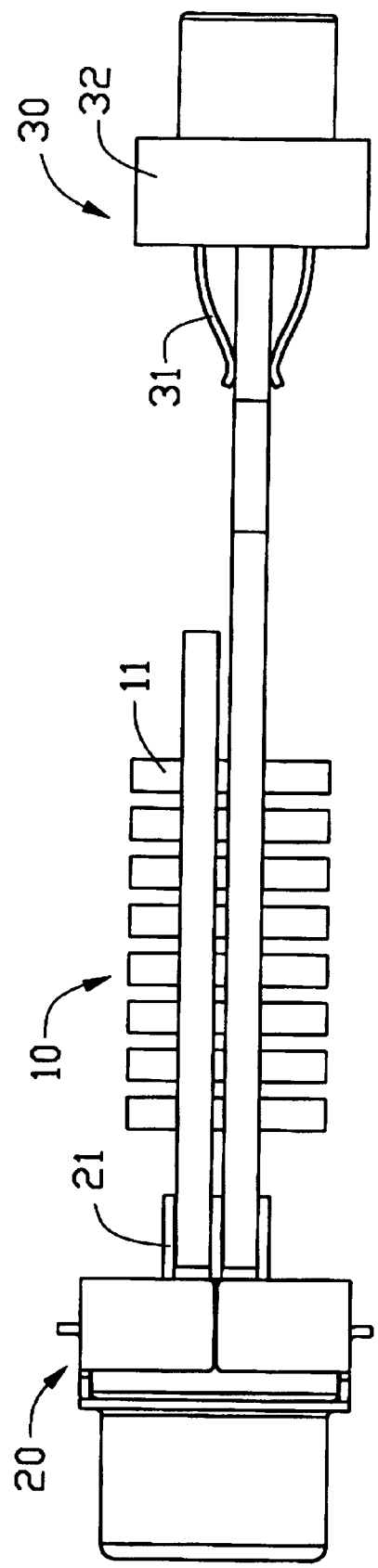
FIG. 6 is an assembled view of FIG. 3.

Referring to FIGS. 1 to 6, an adapter 10 in accordance with the present invention includes a first connector 20 and a second connector 30.

The adapter 10 further comprises an adapting device comprising a plurality of conducting pins 11, a first printed circuit board (PCB) 12, and a second printed circuit board (PCB) 13. The first PCB 12 and the second PCB 13 are both in shape of a flat plate. The second PCB 13 is longer than the first PCB 12 and comprises a narrowed front end 133, an intermediate portion 132, a main body 134, and a rear end 135. The intermediate portion 132 interconnecting the narrowed front end 133 and the main portion 134. The first PCB 12 comprises a plurality of first through holes 121 and the main body 134 of the second PCB 13 comprises a plurality of second through holes 131. The first PCB 12 defines a rear end 122. The first and the second PCBs 12, 13 have equal thickness.

The first connector 20 comprises a plurality of first electrical terminals 21 arranged in the upper, middle, and lower rows 211, 212, 213 and an insulative housing 22 (see FIG. 4) accommodating the terminals 21. The terminals 21 are straight in shape and each have a thickness. The rows 211, 212 and the rows 212, 213 of the electrical terminals 21 are spaced from each other in a distance substantially equal to the thickness of the first PCB 12 and the second PCB 13, respectively.

The second connector 30 comprises a plurality of second electrical terminals 31 arranged in upper and lower rows 311, 312 and a dielectric housing 32 accommodating the terminals 31. The upper and lower rows 311, 312 of the second electrical terminals 31 are curved toward each other near their free ends The curved portions of the two rows 311, 312 of the second electrical terminals 31 are spaced formed each a distance substantially equal to the thickness of the second PCB 13.

In assembly, the first through holes 121 are aligned with the second through holes 131 and the rear ends 122, 135 register with each other. The conducting pins 11 are inserted through and interferentially fitted into the aligned first and second through holes 121, 131 to connect the two PCBs 12, 13 together, wherein a distance is defined between the first PCB 12 and the second PCB 13. The distance is substantially equal to the thickness of each first electrical terminal 21. Selected conducting pins electrically connect circuits of the first PCB 12 and circuits of the second PCB 13 together, whereby electrical signal transmitting paths between the first and second PCBs 12, 13 are created.

The rear ends 122, 135 of the first and second PCBs 12, 13 are respectively disposed between the upper row 211 and the middle row 212, and between the middle row 212 and the lower row 213 of the first terminals 21. Upper and lower surfaces (not labeled) of the rear end 122 of the first PCB 12 are contacted with the upper and the middle rows 211, 212 of the terminals 21 at corresponding regions thereof. A lower surface (not labeled) of the rear end 135 of the second PCB 13 is contacted by the lower row 213 of the terminals 21. The narrowed front end 133 of the second PCB 13 is straddled by the upper and lower rows 311, 312 of the second terminals 31 of the second connector 30 at corresponding regions on the upper and lower surfaces thereof.

After the PCBs 12, 13, the connectors 20, 30, and the conducting pins 11 are assembled together, the assembly is subject to an IR reflow to solder the terminals 21, 31 to the circuits of the PCBs 12, 13 whereby signals from the first connector 20 can be transmitted to the second connector 30, and vice versa. Thus, the adapter is 10 is completed. Additionally, a metallic case (not shown) can be mounted to the adapter to enclose the PCBs 12, 13, the pins 11, and the terminals 21, 31, thereby to enhance the integrity and EMI protection of the adapter 10.

The conducting pins 11 of the present invention can be the conventional header connector pins; thus, the cost of the adapter 10 is more or less reduced. Furthermore, the adapter 10 in accordance with the present invention can be made by an automatic process, without the necessity to manually soldering a flat cable or discrete wires to the terminals of the connectors 20, 30; thus, the cost can be further reduced.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An adapting device for interconnecting terminals of two different types of electrical connectors, comprising:
    a first printed circuit board (PCB) defining a first surface, an opposite second surface and a plurality of through holes therethrough, the first surface having a contacting region near one end of the first PCB for contacting a first row of terminals of a first type electrical connector;
    a second printed circuit board (PCB) defining a first surface facing the second surface of the first PCB, an opposite second surface and a plurality of through holes therethrough in alignment with the through holes of the first PCB, the first and the second surfaces each having a contacting region near one end of the second PCB for contacting a second and a third row of terminals of the first type electrical connector;
    one of the first and the second PCBs having a pair of contacting regions on the two surfaces near the other end thereof for contacting two rows of terminals of a second type electrical connector; and
    a plurality of conducting pins inserted through and retained in the through holes of the first and second PCBs.

2. The adapting device as claimed in claim 1, wherein the conducting pins are interferentially fitted into the through holes of the first and the second PCBs.

3. The adapting device as claimed in claim 1, wherein the one ends of the first and the second PCBs contacting the terminals of the first type electrical connector register with each other.

4. The adapting device as claimed in claim 1, wherein the other end of the one of the first PCB and the second PCB extends substantially longer than that of the other PCB and is straddled by the two rows of terminals of the second type electrical connector.

5. An adapting arrangement between two electrical connectors of different terminal configurations, comprising:
    a first printed circuit board (PCB) defining a first surface, an opposite second surface and a plurality of through holes therethrough, the first surface having a contacting region near one end of the first PCB;
    a second printed circuit board (PCB) defining a first surface facing the second surface of the first PCB, an opposite second surface and a plurality of through holes therethrough in alignment with the through holes of the first PCB, the first and the second surfaces each having a contacting region near one end of the second PCB;
    one of the first and the second PCBs having a pair of contacting regions on the first and the second surfaces near the other end thereof;
    a plurality of conducting pins inserted through and retained in the through holes of the first and the second PCBs;
    a plurality of electrical terminals of a first electrical connector arranged in three rows, the three rows of terminals respectively contacting the contacting regions near the ends of the first and the second PCBs; and
    a plurality of electrical terminals of a second connector arranged in two rows, the two rows of terminals respectively contacting the pair of contacting regions near the other end of the one of the first PCB and the second PCB.

6. The adapting arrangement as claimed in claim 5, wherein the conducting pins together define a distance between the second surface of the first PCB and the first surface of the second PCB.

7. The adapting arrangement as claimed in claim 6, wherein the terminals of the first electrical connector are straight and have a thickness smaller than the distance.

8. The adapting arrangement as claimed in claim 6, wherein the terminals of the first electrical connector are straight and have a thickness substantially equal to the distance.

9. The adapting arrangement as claimed in claim 5, wherein the two rows of terminals of the second electrical connector are curved toward each other at one end thereof and the other end of one of the first PCB and the second PCB extends longer than that of the other PCB and is straddled by the curved terminals of the second electrical connector.

10. The adapting arrangement as claimed in claim 5, wherein the conducting pins are interferentially fitted into the through holes of the first and the second PCBs.

11. An interconnection system comprising:
    a first connector and a second connector being back to back spaced from each other, said first connector and said second connector respectively having terminals thereon wherein said first connector has either a larger number of or more rows of terminals than said second connector; and
    a first PCB (printed circuit board) and a second PCB positioned between said first connector and said second connector, and stacked to each other in a spatial relationship therebetween; and
    the first PCB being longer than said second PCB, both of said first and second PCBs being mechanically and electrically connected to the first connector while only said first PCB being mechanically and electrically connected to the second connector; wherein
    a plurality of conductive pins are positioned between said first PCB and said second PCB and are electrically connected to both.

* * * * *